United States Patent
Lin et al.

(10) Patent No.: US 12,249,495 B2
(45) Date of Patent: Mar. 11, 2025

(54) ETCHING METHOD OF ETCHING APPARATUS

(71) Applicant: Winbond Electronics Corp., Taichung (TW)

(72) Inventors: Shih-Chieh Lin, Taichung (TW); Shuen-Hsiang Ke, Taichung (TW)

(73) Assignee: Winbond Electronics Corp., Taichung (TW)

( * ) Notice: Subject to any disclaimer, the term of this patent is extended or adjusted under 35 U.S.C. 154(b) by 404 days.

(21) Appl. No.: 17/870,794

(22) Filed: Jul. 21, 2022

(65) Prior Publication Data

US 2022/0359173 A1 Nov. 10, 2022

Related U.S. Application Data

(62) Division of application No. 17/163,523, filed on Jan. 31, 2021, now Pat. No. 11,443,928.

(51) Int. Cl.
*H01L 21/302* (2006.01)
*G01B 11/06* (2006.01)
*H01J 37/32* (2006.01)

(52) U.S. Cl.
CPC .... *H01J 37/32963* (2013.01); *G01B 11/0683* (2013.01); *H01L 21/302* (2013.01)

(58) Field of Classification Search
CPC ............ G01B 11/0625; G01B 11/0683; H01L 21/302; H01L 22/26; G03F 1/80
See application file for complete search history.

(56) References Cited

U.S. PATENT DOCUMENTS

| | | | |
|---|---|---|---|
| 2008/0176149 A1* | 7/2008 | Grimbergen | C23F 4/00 216/60 |
| 2014/0295583 A1* | 10/2014 | Nakamoto | H01J 37/32972 156/345.25 |
| 2015/0024521 A1* | 1/2015 | Fukuchi | H01L 22/12 156/345.24 |

\* cited by examiner

*Primary Examiner* — Walter H Swanson
(74) *Attorney, Agent, or Firm* — JCIPRNET

(57) ABSTRACT

An etching method of etching apparatus is disclosed. The etching apparatus performs an etching process on a material to be processed which includes a material layer and a mask layer formed on the material layer. The etching method includes the following steps. The mask layer is etched. A light intensity at a specific wavelength for light generated is detected when the etching process is performed on the mask layer to be processed and an end point detection signal is generated. An etching completion time of the mask layer to be etched is determined according to the end point detection signal. A thickness of the mask layer to be etched is calculated according to the etching completion time. An etching time of the material layer is adjusted according to the thickness of the mask layer to be etched. The material layer is etched after adjusting the etching time.

11 Claims, 5 Drawing Sheets

ETCHING METHOD OF ETCHING APPARATUS

CROSS-REFERENCE TO RELATED APPLICATION

This application is a divisional application of and claims the priority benefit of U.S. application Ser. No. 17/163,523, filed on Jan. 31, 2021, now allowed. The entirety of the above-mentioned patent application is hereby incorporated by reference herein and made a part of this specification.

BACKGROUND

Technical Field

The disclosure relates to a semiconductor device, and particularly relates to an etching apparatus and an etching method thereof.

Description of Related Art

Through the development of semiconductor manufacturing processes in recent years, the demands for integration level and performance of devices have become much higher, and plasma technologies play an essential role in the field of semiconductor manufacture. The plasma technology, which forms plasma by exciting a processing gas, is applied in various semiconductor manufacturing processes, such as the deposition process (e.g., chemical vapor deposition), the etching process (e.g., dry etching), etc. As semiconductor devices are being scaled down and circuit complexity thereof is increasing, a mask film has become more and more complicated, and the aspect ratio of a feature structure formed through etching correspondingly increases. Thus, the requirement for the precision of a plasma process has become much stricter.

In the conventional art, it is common to dispose a light source in an etching chamber to emit a light beam onto an etched substrate. By analyzing the spectrum of reflected light from the etched material, the information about etching depth is obtained, so as to determine whether a target etching end point is reached. Nevertheless, as the aspect ratio of the feature structure on the etched substrate increases, it becomes more difficult for the reflected light to form a complete interference fringe. As a result, an error may easily occur in determining the etching end point, which as a consequence influences the precision of the semiconductor manufacturing process.

SUMMARY

Embodiments of the disclosure provide an etching apparatus and an etching method thereof capable of increasing the precision of a semiconductor manufacturing process.

An etching apparatus according to an embodiment of the disclosure includes an etching device and a control device. The etching device performs an etching process on a material to be processed to form a feature structure. The etching device includes an end point detector, detecting a light intensity at a specific wavelength for light generated when the etching process is performed on the material to be processed and generating an end point detection signal. The material to be processed includes a material layer and at least one mask layer formed on the material layer. The etching device also includes a control device, coupled to the etching device and determining an etching completion time of the mask layer according to the end point detection signal, calculating a thickness of the mask layer according to the etching completion time, and adjusting an etching time of the material layer according to the thickness of the mask layer.

Another embodiment of the disclosure provides an etching method of an etching apparatus for performing an etching process on a material to be processed to form a feature structure. The etching method includes steps as follows. A light intensity at a specific wavelength is detected for light generated when the etching process is performed on the material to be processed, and an end point detection signal is generated. The material to be processed includes a material layer and at least one mask layer formed on the material layer; An etching completion time of the mask layer is determined according to the end point detection signal. A thickness of the mask layer is calculated according to the etching completion time. An etching time of the material layer is adjusted according to the thickness of the mask layer.

Based on the above, in the embodiments of the disclosure, the etching completion time of the mask layer is determined according to the end point detection signal, the thickness of the mask layer is calculated according to the etching completion time, and the etching time of the material layer is adjusted according to the thickness of the mask layer. By calculating the thickness of the mask layer according to the etching completion time of the mask layer, the thickness of the mask layer can be precisely determined. Consequently, the progress of the etching process on the material layer can be precisely determined. Thus, the precision of the semiconductor manufacturing process can be effectively facilitated.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
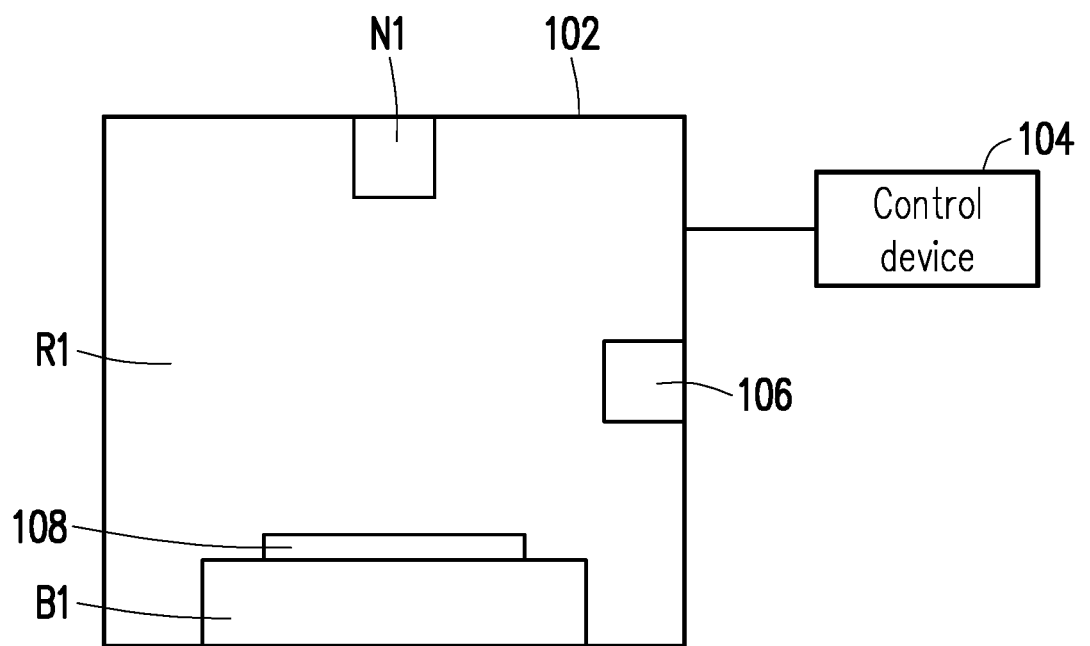
FIG. 1 is a schematic diagram illustrating an etching apparatus according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
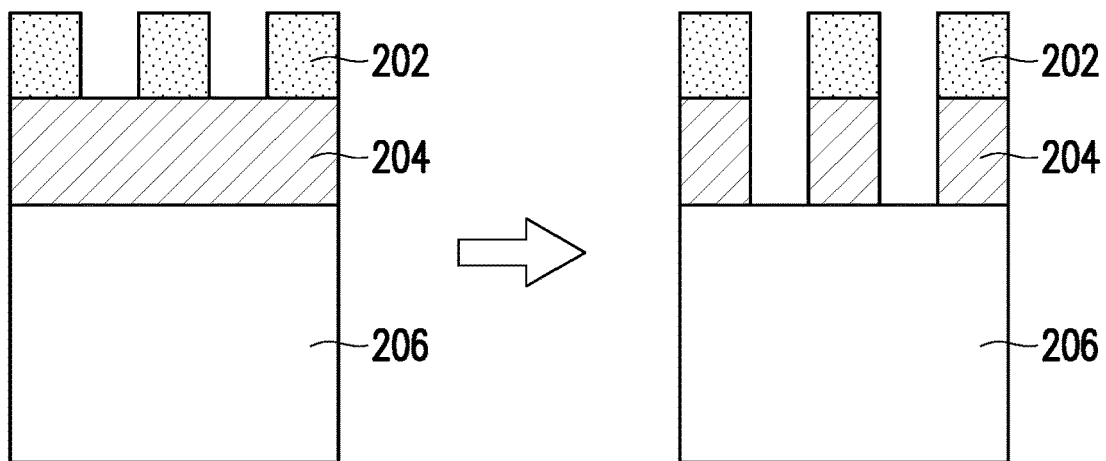
FIG. 2 is a schematic view illustrating a material to be processed according to an embodiment of the disclosure.

FIG. 1 is a schematic diagram illustrating an etching apparatus according to an embodiment of the disclosure. Referring to FIG. 1, an etching apparatus 100 includes an etching device 102 and a control device 104. The etching device 102 is coupled to the control device 104. The etching device 102 performs an etching process on a material 108 to be processed to form a feature structure on the material 108 to be processed. As shown in FIG. 2, the material 108 to be processed may include a photoresist layer 202, a mask layer 204, and a material layer 206. The mask layer 204 is formed on the material layer 206, and the photoresist layer 202 is formed on the mask layer 204. In some embodiments, the photoresist layer 202 may be patterned by performing a photolithography process, for example, so that the photoresist layer 202 is provided with a feature pattern. In addition, by using the photoresist layer 202 provided with the feature pattern as a mask, the mask layer 204 and the material layer 206 are etched to form a feature structure. In some embodiments, the material layer 206 may be an elemental semiconductor substrate (e.g., a silicon substrate or a germanium substrate) or a compound semiconductor substrate (e.g., a silicon carbide substrate or a GaAs substrate). In some embodiments, the mask layer 204 may be formed by a dielectric material. Examples of the dielectric material include SiO, SiN, SiON, etc.

In the embodiment, the etching device 102 may be, for example, a plasma etching device. However, the disclosure is not limited thereto. More specifically, the etching device 102 may include an etching chamber R1, an etching gas generator N1, and an end detector 106. The etching chamber R1 may accommodate the material 108 to be processed. As shown in FIG. 1, the material 108 to be processed may be placed on a base B1 in the etching chamber R1. The etching gas generator N1 may generate an etching gas to the etching chamber R1, so as to generate a plasma with which an etching process is performed on the material 108 to be processed. The end point detector 106 may detect a light intensity at a specific wavelength for light generated when the material 108 to be processed is etched, and generates an end point detection signal. For example, in the embodiment, the end point detector 106 may detect the spectrum of light emitted from the plasma during the plasma etching process. As the spectrum may change significantly when different material layers are etched, the end point detection signal generated by the end point detector 106 may correspondingly exhibit changes in signal intensity, which indicate whether the etching end point is reached.

The control device 104 may be a computer or other electronic devices with computing capabilities. However, the disclosure is not limited thereto. The control device 104 may determine the etching completion time of the mask layer 204, i.e., the time required for the mask layer 204 to be etched to the end point (material layer 206), as shown on the right side of FIG. 2, according to the end point detection signal The control device 104 may calculate the thickness of the mask layer 204 according to the etching completion time of the mask layer 204. For example, the control device 104 may multiply the etching completion time of the mask layer 204 by the etching rate of the mask layer 204 to derive the thickness of the mask layer 204. The etching rate of the mask layer 204 may be obtained by, for example, collecting data through conventional experimentation. The thickness change of the mask layer 204 also changes the aspect ratio of the feature structure formed on the material 108 to be processed, and the etching time required to etch the same depth in the material layer 206 differs as the aspect ratio differs. Therefore, the thickness changes of the mask layer 206 may correspond to different etching times of the material layer 206. After obtaining the thickness of the mask layer 204, the control device 104 may adjust the etching time of the material layer 206 according to the thickness of the mask layer 204 to prevent the thickness of the mask layer 204 from being changed due to a manufacturing factor or other factors, which leads to under-etching or over-etching of the material layer 206. Besides, unlike the conventional art which requires an additional light source in the etching chamber so as to obtain the information of the etching depth by analyzing reflected light, the etching apparatus of the embodiment is capable of making detection directly according to the light emitted from the plasma during the plasma etching process, and calculating the thickness of the mask layer 204 according to the etching time. Therefore, the etching apparatus according to the embodiment of the disclosure is capable of accurately obtaining the thickness (etching depth) information of the mask layer 204, thereby precisely etching the material layer 206, without increasing the measurement cost or interrupting the etching process to measure the etching depth.

More specifically, the control device 104 may calculate a thickness difference according to the thickness of the mask layer 204, such as subtracting the default thickness (e.g., standard thickness) of the mask layer 204 from the calculated thickness of the mask layer 204 to obtain the thickness difference (i.e., the thickness change value of the mask layer 204), and adjust the etching time of the material layer 206, such as adding or reducing a compensation time to or from the etching time, according to the thickness difference, so as to ensure the material layer 206 to be etched to a predetermined depth. The relationship between the thickness difference and the compensation time for etching the material layer 206 may be obtained by, for example, collecting data through regular experimentation.

Figure 3:
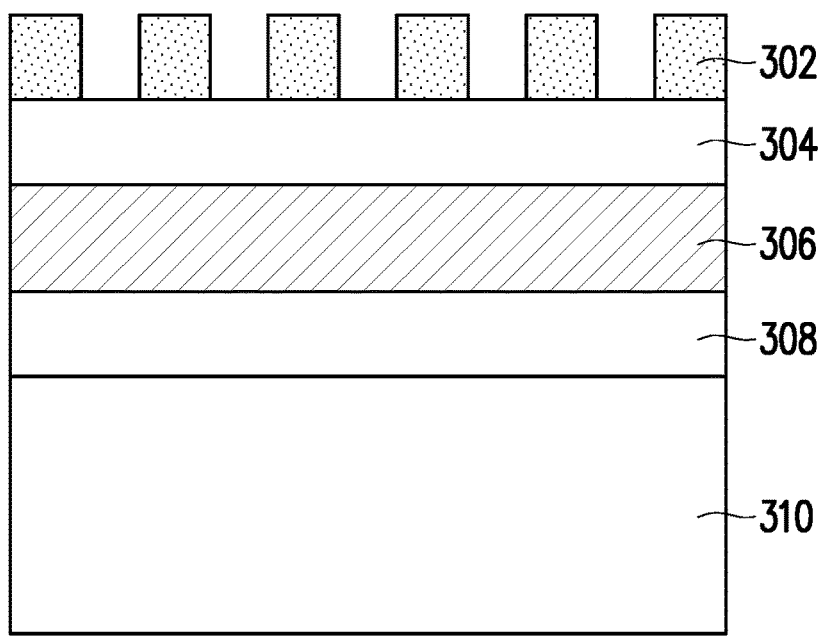
FIG. 3 is a schematic view illustrating a material to be processed according to another embodiment of the disclosure.
Figure 4A:
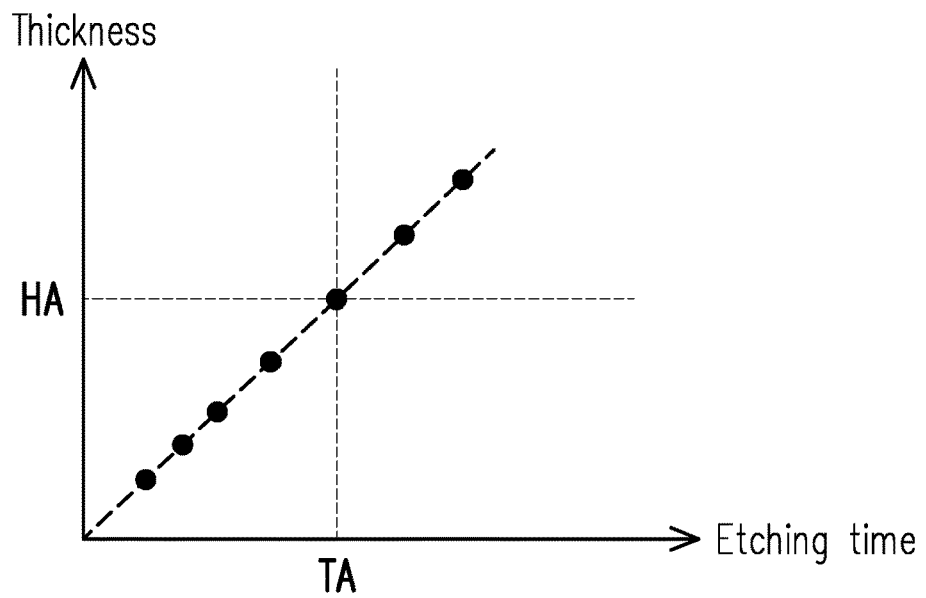
FIGS. 4A to 4C are schematic diagrams illustrating relationship curves between etching times of mask layers and corresponding etched thicknesses.
Figure 4B:
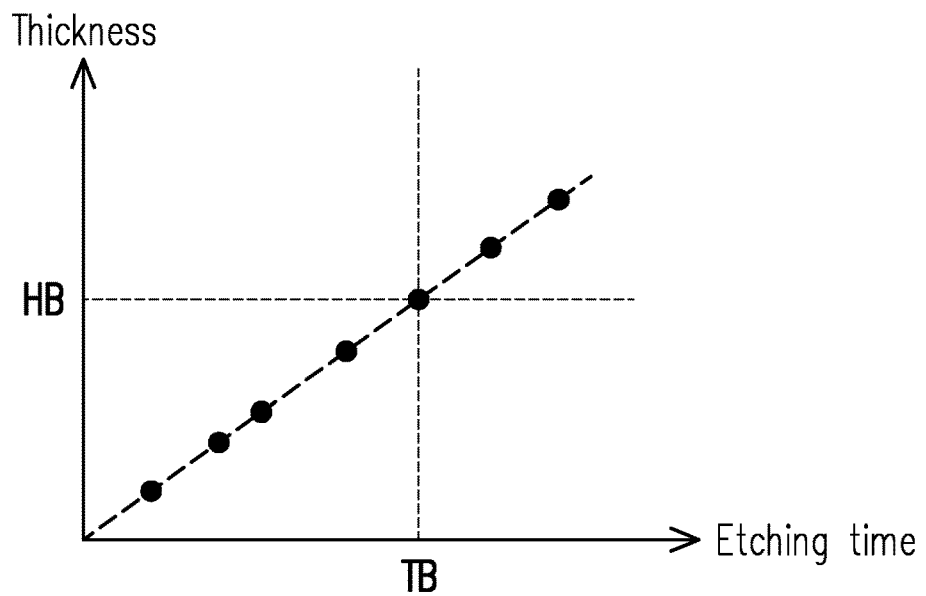
Figure 4C:
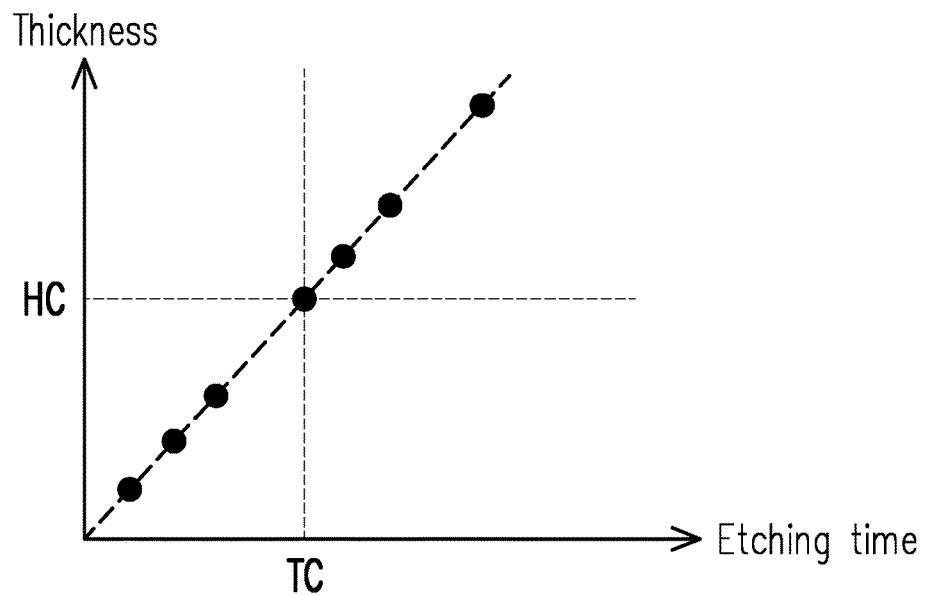

In some embodiments, the material 108 to be processed may include a plurality of mask layers, instead of including only one mask layer like the embodiment shown in FIG. 2. As shown in FIG. 3, the material 108 to be processed may include a photoresist layer 302, three mask layers 304, 306, and 308, and a material layer 310. In some embodiments, the material layer 310 may be an elemental semiconductor substrate (e.g., a silicon substrate or a germanium substrate) or a compound semiconductor substrate (e.g., a silicon carbide substrate or a GaAs substrate). In some embodiments, the mask layers 304, 306, and 308 may be formed by a dielectric material. Examples of the dielectric material include SiO, SiN, SiON, etc. Similarly, the end point detector 106 may detect the spectrum of light emitted by the plasma during the plasma etching process to generate the end point detection signal. For example, the end point detector 106 may detect the light intensities at different specific wavelengths respectively corresponding to different mask layers, so as to generate corresponding end point detection signals. The control device 104 may determine the etching completion times of the mask layers 304, 306, and 308 according to the end point detection signals corresponding to the mask layers 304, 306, and 308, and calculate the sum of the thicknesses of the mask layers 304, 306, and 308 according to the etching completion times of the mask layers 304, 306, and 308 and the etching rates of the mask layers 304, 306, and 308, respectively. A thickness sum H of the mask layers 304, 306, and 308 may be calculated according to the following equation:

$$H = R_A \times T_A + R_B \times T_B + R_C \times T_C \tag{1}$$

wherein RA, RB, and RC respectively represent the etching rates of the mask layers 304, 306, and 308, and TA, TB, and TC respectively represent the etching completion times of the mask layers 304, 306, and 308. In some embodiments, the relationships between the etching times of the mask layers 304, 306, and 308 and the corresponding etched thicknesses may also be stored in a storage circuit of the control device 104. After obtaining the etching completion times of the mask layers 304, 306, and 308 according to the end point detection signals, the control device 104 may obtain the thicknesses of the mask layers 304, 306, and 308 corresponding to the etching completion times of the mask layers 304, 306, and 308 by looking up a table. FIGS. 4A to 4C are schematic diagrams illustrating relationship curves between the etching times of the mask layers 304, 306, and 308 and the corresponding etched thicknesses. As shown in FIGS. 4A to 4C, the curves corresponding to different mask layers have different slopes (etching rates), and etching completion times TA, TB, and TC may respectively correspond to thicknesses HA, HB, and HC of the mask layers 304, 306, and 308. The control device 104 may add up the thicknesses HA, HB, and HC to obtain the thickness sum H of the mask layers 304, 306, and 308.

Figure 5:
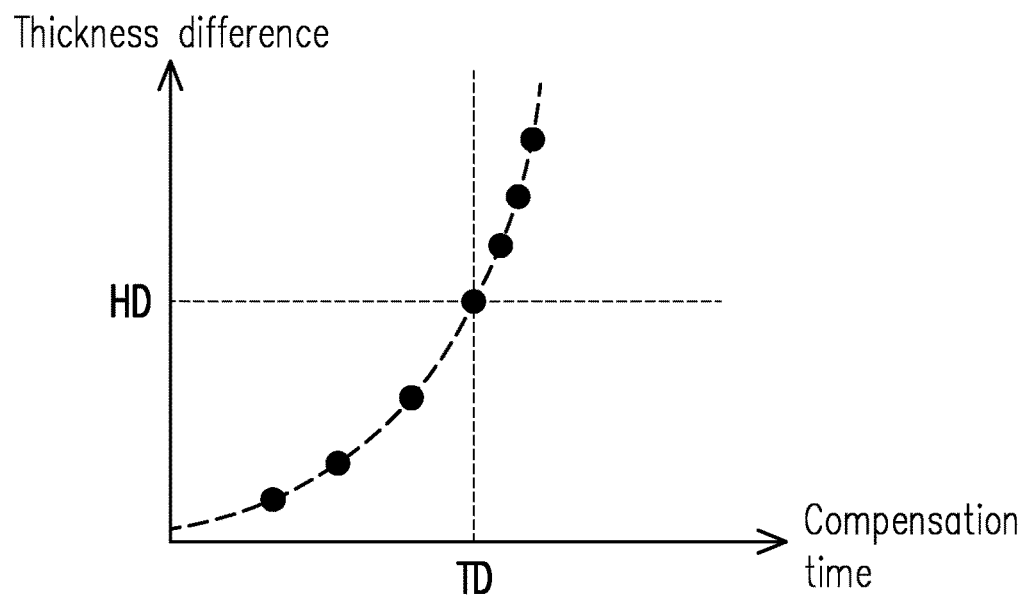
FIG. 5 is a schematic view illustrating a relationship curve between a compensation time for etching a material layer and a thickness difference according to an embodiment of the disclosure.

Similarly, the control device 104 may subtract a sum of default thicknesses of the mask layers 304, 306, and 308 from the thickness sum H of the mask layers 304, 306, and 308 to obtain a thickness difference HD (i.e., a total thickness change value of the mask layers 304, 306, and 308), and adjust the etching time of the material layer 310 according to the thickness difference. For example, the storage circuit of the control device 104 may store the etching compensation time of the material layer 310 corresponding to the thickness difference. Accordingly, the control device 104 may obtain the etching compensation time of the material layer 310 corresponding to the thickness difference by looking up a table. For example, FIG. 5 is a schematic view illustrating a relationship curve between the compensation time for etching the material layer 310 and the thickness difference according to an embodiment of the disclosure. As shown in FIG. 5, each thickness difference may have a corresponding compensation time. For example, the thickness difference HD of the embodiment of FIGS. 4A to 4C may correspond to a compensation time TD. The control device 104 may add the compensation time TD to the etching time of the material layer 310 to ensure the material layer 310 is precisely etched to an expected depth. The thickness difference HD may be a positive value or a negative value, and the corresponding compensation time TD may also be a positive value or a negative value. In other words, the control device 104 may increase or decrease the etching time of the material layer 310, so as to precisely etch the material layer 310.

Figure 6:
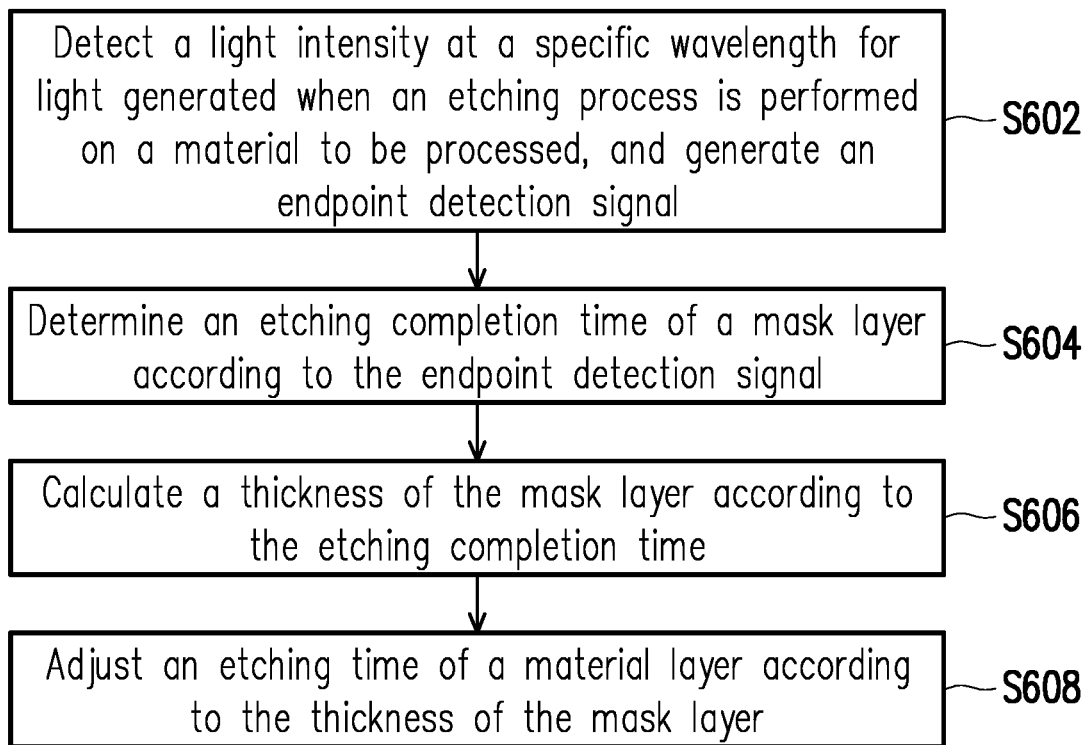
FIG. 6 is a flowchart illustrating an etching method of an etching apparatus according to an embodiment of the invention.

FIG. 6 is a flowchart illustrating an etching method of an etching apparatus according to an embodiment of the invention. According to the above embodiment, the etching method of the etching apparatus includes steps as follows. First of all, the light intensity at the specific wavelength is detected for the light generated when the etching process is performed on the material to be processed and the end point detection signal is generated (Step S602). The material to be processed includes the material layer and at least one mask layer formed on the material layer. The etching process may be a plasma etching process. However, the disclosure is not limited thereto. The etching apparatus may include an etching chamber containing the material to be processed. By generating an etching gas and providing the etching gas to the etching chamber, plasma is generated with which the etching process is performed on the material to be processed. Then, the etching completion time of the mask layer is determined according to the end point detection signal (Step S604). Then, the thickness of the mask layer is calculated according to the etching completion time (Step S606). Then, the etching time of the material layer is adjusted according to the thickness of the mask layer (Step S608). For example, the thickness difference of the mask layer may be calculated according to the thickness of the mask layer, and the etching time of the material layer may be adjusted according to the thickness difference. The thickness difference may be a difference obtained by subtracting the default thickness (e.g., the standard thickness of the mask layer) from the thickness of the mask layer.

In an embodiment having multiple mask layers, the etching completion time of each mask layer may be determined according to the end point detection signal corresponding to each mask layer, and the thickness of each mask layer may be calculated according to the etching completion time of each mask layer. Then, the etching time of the material layer is adjusted according to the sum of the thicknesses of the mask layers. For example, the thickness difference may be obtained by subtracting the sum of the default thicknesses of the mask layers from the sum of the thicknesses of the mask layers, and the etching time of the material layer may be adjusted according to the thickness difference.

In view of the foregoing, in the embodiments of the disclosure, the etching completion time of the mask layer is determined according to the end point detection signal, the thickness of the mask layer is calculated according to the etching completion time, and the etching time of the material layer is adjusted according to the thickness of the mask layer. By calculating the thickness of the mask layer according to the etching completion time of the mask layer, the thickness of the mask layer can be precisely determined. Consequently, the progress of the etching process on the material layer can be precisely determined. Thus, the precision of the semiconductor manufacturing process can be effectively facilitated. Besides, unlike the conventional art which requires an additional light source in the etching chamber so as to obtain the information of the etching depth by analyzing reflected light, the etching apparatus according to the embodiments of the disclosure is capable of accurately obtaining the thickness (etching depth) information of the mask layer, thereby precisely etching the material layer, without increasing the measurement cost or interrupting the etching process to measure the etching depth.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. An etching method of an etching apparatus for performing an etching process on a material to be processed to form a feature structure, wherein the material to be processed comprises a material layer and at least one mask layer formed on the material layer, the etching method comprising:
etching the mask layer;

detecting a light intensity at a specific wavelength for light generated when the etching process is performed on the mask layer to be processed and generating an end point detection signal;
determining an etching completion time of the mask layer to be etched according to the end point detection signal;
calculating a thickness of the mask layer to be etched according to the etching completion time;
adjusting an etching time of the material layer according to the thickness of the mask layer to be etched; and
etching the material layer after adjusting the etching time of the material layer.

2. The etching method as claimed in claim 1, comprising:
multiplying the etching completion time of each of the at least one mask layer by a corresponding etching rate to obtain the thickness of each of the at least one mask layer.

3. The etching method as claimed in claim 1, wherein the etching apparatus comprises an etching chamber containing the material to be processed, the etching method comprising:
generating an etching gas and providing the etching gas to the etching chamber to generate plasma for performing the etching process on the material to be processed.

4. The etching method as claimed in claim 1, wherein the mask layer is formed by a dielectric material.

5. The etching method as claimed in claim 1, comprising:
calculating a thickness difference of the mask layer according to the thickness of the mask layer; and
adjusting the etching time of the material layer according to the thickness difference.

6. The etching method as claimed in claim 5, wherein the thickness difference is equal to a value obtained by subtracting a default thickness from the thickness of the mask layer.

7. The etching method as claimed in claim 1, wherein the material to be processed comprises a plurality of mask layers, and the etching method comprises:
determining an etching completion time of each of the mask layers according to the end point detection signal;
calculating a thickness of each of the mask layers according to the etching completion time of each of the mask layers; and
adjusting the etching time of the material layer according to a sum of the thicknesses of the mask layers.

8. The etching method as claimed in claim 7, comprising:
calculating a thickness difference of the mask layers according to the sum of the thicknesses of the mask layers; and
adjusting the etching time of the material layer according to the thickness difference.

9. The etching method as claimed in claim 8, wherein the thickness difference is equal to a value obtained by subtracting a sum of default thicknesses of the mask layers from the sum of the thicknesses of the mask layer.

10. The etching method as claimed in claim 1, wherein the material layer is an elemental semiconductor substrate or a compound semiconductor substrate.

11. The etching method as claimed in claim 9, wherein the dielectric material comprises SiO, SiN or SiON.

* * * * *